(12) United States Patent
Yen

(10) Patent No.: US 8,179,771 B2
(45) Date of Patent: May 15, 2012

(54) METHOD AND APPARATUS FOR TUNING AN ANALOG FILTER

(75) Inventor: Kuang-Yu Yen, Tai-Chung (TW)

(73) Assignee: Realtek Semiconductor Corp., Hsinchu (TW)

( * ) Notice: Subject to any disclaimer, the term of this patent is extended or adjusted under 35 U.S.C. 154(b) by 1994 days.

(21) Appl. No.: 10/907,152

(22) Filed: Mar. 22, 2005

(65) Prior Publication Data

US 2005/0215225 A1    Sep. 29, 2005

(30) Foreign Application Priority Data

Mar. 26, 2004    (TW) .............................. 93108442 A

(51) Int. Cl.
*G11B 7/00* (2006.01)

(52) U.S. Cl. ............ 369/124.05; 369/124.13; 369/59.21

(58) Field of Classification Search ............. 369/124.01, 369/124.05, 124.13
See application file for complete search history.

(56) References Cited

U.S. PATENT DOCUMENTS

| 5,172,357 | A | * | 12/1992 | Taguchi | ..................... 369/47.28 |
|---|---|---|---|---|---|
| 5,373,493 | A | * | 12/1994 | Iizuka | ..................... 369/124.14 |
| 5,729,511 | A | | 3/1998 | Schell et al. | |
| 5,892,632 | A | | 4/1999 | Behrens et al. | |
| 6,003,051 | A | * | 12/1999 | Okazaki | ........................... 708/3 |
| 6,014,554 | A | * | 1/2000 | Smith | .......................... 455/340 |
| 6,418,110 | B1 | * | 7/2002 | Baird | ......................... 369/124.1 |
| 2005/0162769 | A1 | * | 7/2005 | Yoshida et al. | ................. 360/39 |

FOREIGN PATENT DOCUMENTS

| TW | 359339 | 5/1999 |
|---|---|---|
| TW | 397977 | 7/2000 |
| TW | 504674 | 10/2002 |

* cited by examiner

*Primary Examiner* — Adam R Giesy
(74) *Attorney, Agent, or Firm* — Thomas, Kayden, Horstemeyer & Risley, LLP

(57) ABSTRACT

A method for automatically tuning an analog filter includes the steps of making an analog filter filter an input signal to output a filtered signal according to a filtering characteristic, sampling the filtered signal to generate sampled data, computing a sector data number of the sampled data that does not complying with a specified data format, and tuning the filtering characteristic of the analog filter according to the sector data number.

18 Claims, 2 Drawing Sheets

METHOD AND APPARATUS FOR TUNING AN ANALOG FILTER

BACKGROUND OF INVENTION

1. Field of the Invention

The present invention relates to a method and an apparatus for tuning an analog filter, and more particularly, to a method and an apparatus for tuning parameter settings of an analog filter using output data.

2. Description of the Prior Art

In data access systems, multiple bits of a digital signal are encoded as a symbol for increasing the transmission bit rate and reducing bit error rates caused by noise. For example, the run-length limited (RLL) code is used for encoding in compact discs (CDs) or digital video discs (DVDs) systems. RLL (n, k) indicates that a symbol is composed of a serious of 1 or 0 in length of (n+1) to (k+1). Each bit of the digital signals is recorded in the form of pit/lands on the discs and is accessed by laser-light spot in the CD/DVD systems. However, the laser-light spot covers several pits/lands and generates inter-symbol interference (ISI), which leads to a serious bit error rate and affects the performance of data access systems. Generally speaking, the receiver of a data access system uses an analog filter to filter the received symbols, which reduces the ISI to lower the bit error rate. Thus, performance of the analog filter affects the performance of the data access system.

Parameter settings of the analog filter affect the performance of the analog filter. For example, the jitter of accessing signals corresponds to a parameter setting of the analog filter. Thus, the prior art manufacturers use different parameters to tune the analog filter. Because the parameter settings of the analog filter correspond to the brand or type of the disc machine including the analog filter, the prior art method of tuning the analog filter repeatedly uses a manual trial-and-error mechanism to find the best parameters corresponding to the analog filter of the disk machine. Thus, manufacturers make efforts to find the best parameters according to the analog filter of each disc machine.

SUMMARY OF INVENTION

Thus, the present invention provides a method and an apparatus for tuning the parameter settings of an analog filter using output data, to solve the above-mentioned problem.

According to an embodiment of the present invention, a method for automatically tuning an analog filter includes the steps of making the analog filter filter an input signal to output a filtering signal according to a filtering characteristic, sampling the filtering signal to generate a sampled data, computing a sector data number of the sampled data that does not complying with a specified data format, and tuning the filtering characteristic of the analog filter according to the sector data number.

In addition, according to another embodiment of the present invention, an apparatus for automatically tuning an analog filter comprises a filter for filtering an input signal to output a filtering signal according to a filtering characteristic, a sampling module electronically coupled to the filter for sampling the filtering signal to generate a sampled data, a computation module electronically coupled to the sampling module for computing a sector data number of the sampled data that does not complying with a specified data format, and a control module electronically coupled to the computation module for tuning the filtering characteristic of the analog filter according to the sector data number.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
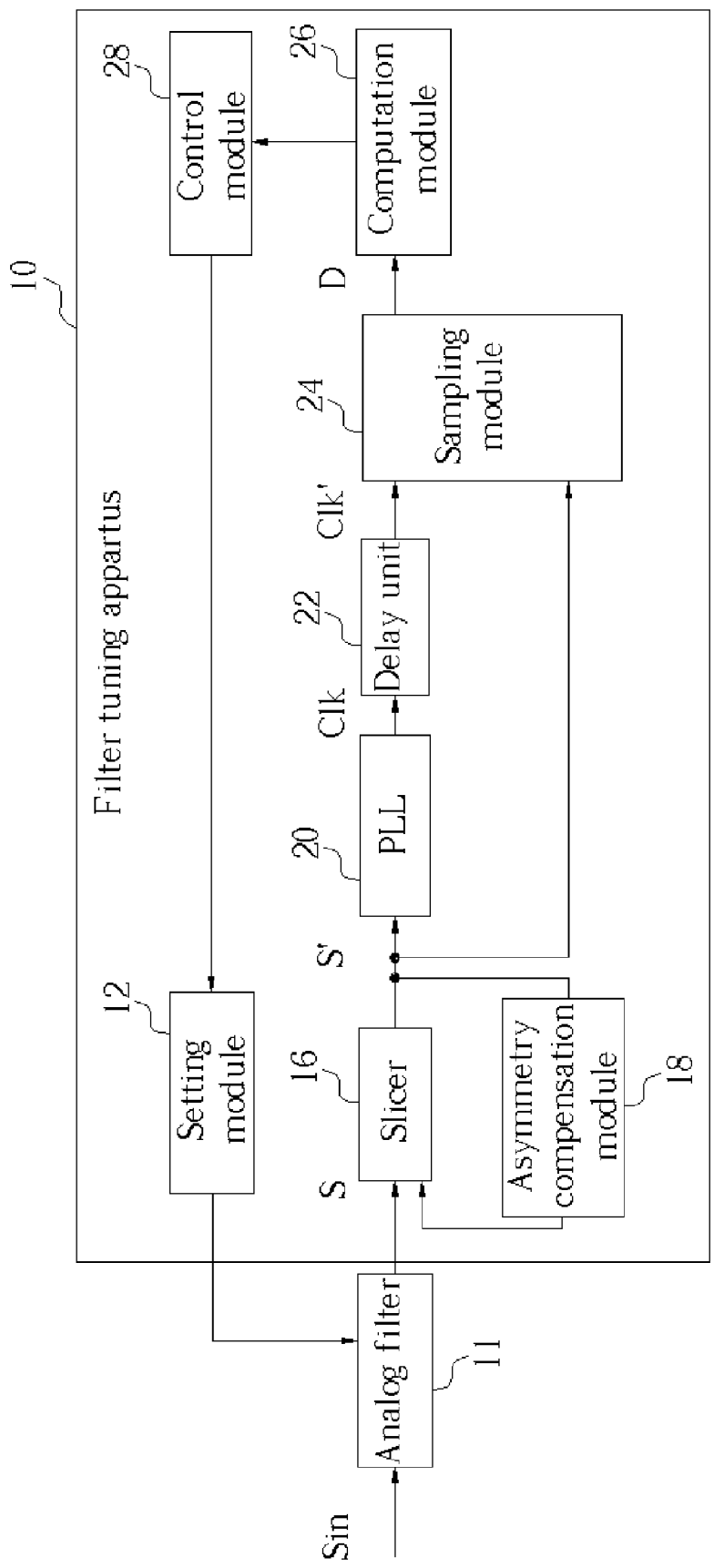
FIG. 1 is a functional block diagram of a filter tuning apparatus according to the present invention.

Please refer to FIG. 1. FIG. 1 shows a functional block diagram of a filter tuning apparatus 10 according to the present invention. The filter tuning apparatus is used to tune the filtering characteristic of the analog filter 11. In an embodiment of the present invention, the filter tuning apparatus 10 comprises a setting module 12, a slicer 16, an asymmetry compensation module 18, a phase locked loop (PLL) 20, a delay unit 22, a sampling module 24, a computation module 26, and a control module 28.

Figure 2:
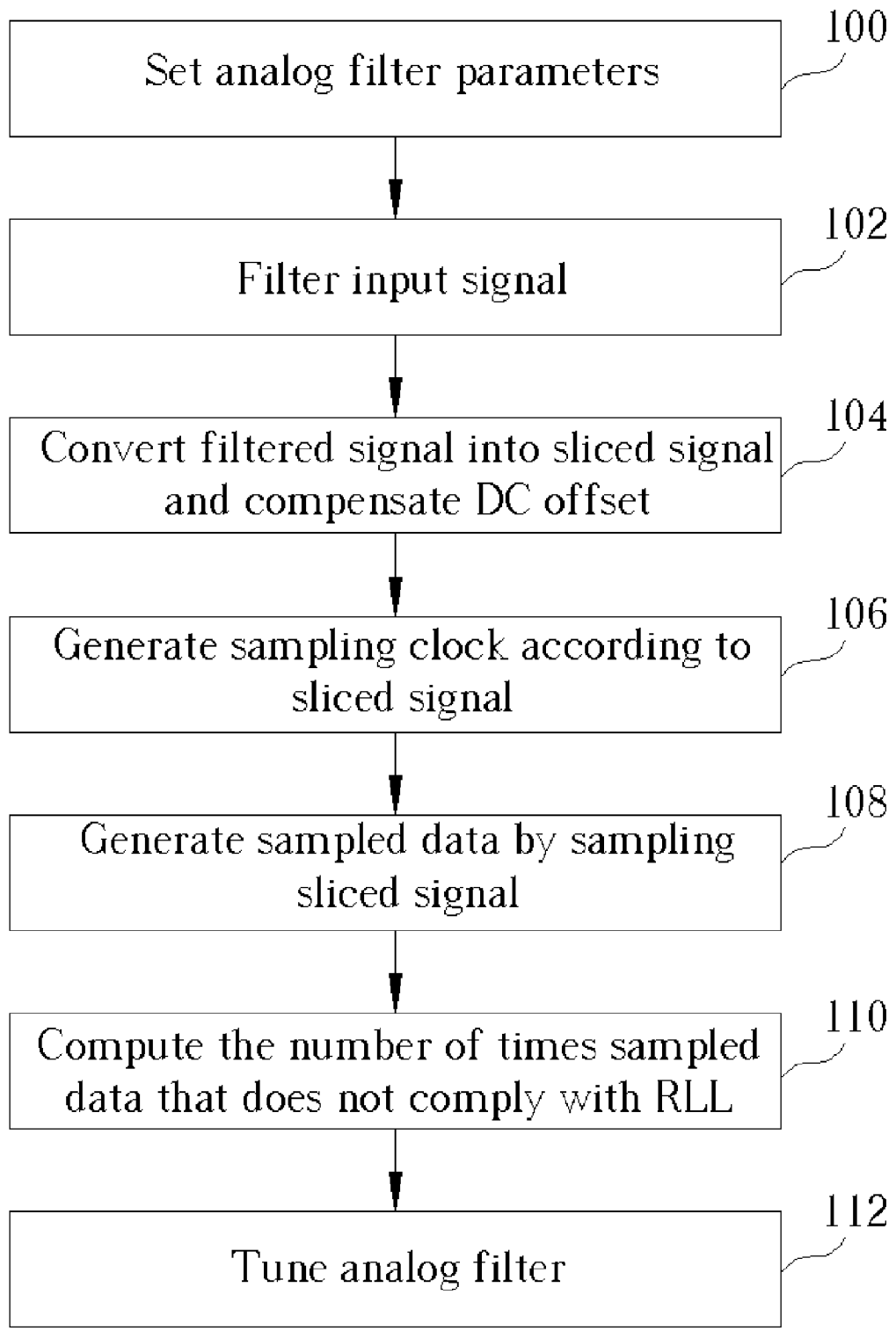
FIG. 2 is a flowchart illustrating operation of the filter tuning apparatus shown in FIG. 1.

Please refer to FIG. 2. FIG. 2 is a flowchart illustrating operation of the filter tuning apparatus 10 shown in FIG. 1. The operation includes the following steps:

Step 100: The setting module 12 sets the filtering parameters of the analog filter 11.

Step 102: The analog filter 11 filters an input signal Sin to output a filtered signal S.

Step 104: The slicer 16 converts the filtered signal S into a sliced signal S', and the asymmetry compensation module 18 removes the DC offset of the filtered signal S according to the sliced signal S'.

Step 106: The PLL 20 generates the corresponding sampling clock Clk according to the sliced signal S'.

Step 108: The delay unit 22 tunes the phase of the sampling clock Clk to output the tuned sampling clock Clk' to the sampling module 24, and the sampling module 24 samples the sliced signal S' to generate sampled data D according to the sampling clock Clk'.

Step 110: The computation module 26 computes the sector data number of the sampled data that does not comply with the rules for an RLL code.

Step 112: The control module 28 decides how to tune the parameters of the analog filter 11 according to the sector data number.

In an embodiment, the setting module 12 pre-stores multiple sets of filtering parameters that correspond to different filtering characteristics to control and tune the analog filter 11. Shown as FIG. 1, the analog filter 11 filters an input signal Sin (like EFM data accessing from a disk) to generate a filtered signal S. The signal characteristic of the filtered signal S differs according to the filtering characteristic that corresponds to the parameter settings of the analog filter. The slicer 16 converts the input signal (i.e. the filtered signal S) into a corresponding digital signal S' according to a slice level. In addition, the asymmetry compensation module 18 coupled to the slicer 16 forms a feedback loop for removing the DC offset of the filtered signal S. That is, tuning the slice level of the slicer 16 lowers the DC offset (step 104). The PLL 20 generates a corresponding sample clock Clk according to the sliced signal S'.

In this embodiment, the filter tuning apparatus 10 sets a delay unit 22 for delaying the sample clock Clk outputted by the PLL 20 to output a corresponding sample clock Clk'. The function of the delay unit 22 is described in the following. The sampling module 24 samples the sliced signal S' to output sampled data D according to the sampling clock Clk' (step 108).

In this embodiment, the analog filter 11 can be viewed as an equalizer for tuning the input signal Sin to filter noise. In addition, the input signal Sin complies with the specifications for CDs and DVDs, so the sampled data D sampled by the sampling module 24 complies with the characteristics of the run-length limited code. Take RLL (2, 10) as an example. The length of the continuous 1 or 0 of the sampled data D complies with 3T to 11T. Thus, the computation module 26 computes the sector data number of the sampled data D that does not comply with the RLL (2, 10) code. That is, the computation module 26 computes the sector data number of the sampled data in which the length of the continuous 1 or 0 is greater than 11T or smaller than 3T. The sector data number of the sampled data D that does not comply with RLL (2, 10) code means that the analog filter 11 can not filter the ISI of the sampled data D well according to the current filtering parameters. Thus, the parameter settings of the analog filter 11 can be judged by the computed sector data number.

In the circuit implementation, the filter tuning apparatus 10 uses multiple sets of filtering parameters to tune the filtering characteristic of the analog filter 11 one by one and judge each filtering characteristic of the analog filter 11 using the sector data number that does not comply with the RLL (2, 10) code. It should be noted that the filter tuning apparatus 10 and tuning method can tune the analog filter 11 automatically in this embodiment, and apply to various brands or types of disc systems with various mechanical characteristics.

In addition, the delay unit 22 tunes the phase of the sampling clock Clk, which tunes the sampling position of the sliced signal. The sampling position of the sliced signal corresponds to the filtering characteristics of the analog filter 11. If the filtering characteristics of the analog filter 11 are set well, the sampling position of the sliced signal will be far from the signal edge so that the jitter of the sliced signal S' is further reduced. In this embodiment, the sampling position is tuned by the delay unit 22. If a poor filtering characteristic of the analog filter 11 leads to more ISI of the filtered signal S, the sampling results derived by the biased sampling position will violate the characteristic of the RLL code. This embodiment applies the sector data number that does not comply with the RLL code to judge the filtering characteristic of the analog filter 11. Thus, the computation module 26 can calculate and compare the sector data numbers corresponding to various parameters to quickly find the best parameter of the analog filter 11 using the biased sampling position. In other words, the embodiment applies the delay unit 22 to increase the speed of finding the best parameter from a variety of filtering parameters. Thus, if the delay unit 22 is used in the filter tuning apparatus 10 to generate a timing delay for tuning the sampling clock, the timing can be decided according to user requirements. If the filter tuning apparatus 10 does not use the delay unit 22, the sampling module 24 directly uses the sampling clock Clk to sample the sliced signal S'. In the above-mentioned condition, the filter tuning apparatus 10 also judges the best filtering parameter using the sector data number that does not comply with the RLL characteristic, which belongs to the scope of the present invention.

Compared to the prior art, the present invention method and apparatus for tuning an analog filter utilize the RLL characteristic of the CD/DVD specifications to judge the ISI conditions using various filtering parameters. Thus, the best filtering parameter can be chosen to tune the filtering characteristic of the analog filter. In addition, the present invention method and apparatus for tuning analog filter use the biased sampling position to increase the speed of choosing the best filtering parameter.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A method for automatically tuning an analog filter, the method comprising:
   filtering an input signal to output a filtered signal according to a filtering characteristic;
   sampling the filtered signal to generate sampled data;
   computing a sector data number of the sampled data that does not comply with a specified data format; and
   tuning the filtering characteristic of the analog filter according to the sector data number, wherein the tuning comprises:
      determining which filtering parameter among a plurality of available filtering parameters to select for application to the analog filter;
      selecting one of the filtering parameters among the plurality of available filtering parameters;
      communicating to a setting module the selected filtering parameter; and
      setting by the setting module the analog filter according to the selected filtering parameter.

2. The method of claim 1, wherein the selected filtering parameter corresponds to the filtering characteristic.

3. The method of claim 1, wherein the specified data format is a run-length limited (RLL) code.

4. The method of claim 3, wherein the RLL code is the RLL(2, 10) code.

5. The method of claim 1, wherein the step of sampling the filtered signal further comprises:
   generating a sampling clock according to the filtered signal; and
   sampling the filtered signal to generate the sampled data according to the sampling clock.

6. The method of claim 5, wherein the step of generating the sampling clock further comprises tuning the sampling clock.

7. The method of claim 1, further comprising:
   generating a sliced signal according to the filtered signal; and
   generating the sampled data according to the sliced signal.

8. The method of claim 7, wherein the step of generating the sampled data further comprises:
   generating a sampling clock according to the sliced signal; and
   sampling the sliced signal to generate the sampled data according to the sampling clock.

9. The method of claim 8, wherein the step of generating the sampling clock further comprises tuning the sampling clock.

10. The method of claim 7, further comprising:
    removing the DC offset of the filtered signal according to the sliced signal.

11. An apparatus for automatically tuning an analog filter, the apparatus comprising:
    a filter for filtering an input signal to output a filtered signal according to a filtering characteristic;
    a sampling module coupled to the filter for sampling the filtered signal to generate a sampled data;

a computation module coupled to the sampling module for computing a sector data number of the sampled data that does not comply with a specified data format;

a control module coupled to the computation module for tuning the filtering characteristic of the analog filter according to the sector data number; and a setting module coupled to the filter for setting the analog filter according to a first filtering parameter and setting the filtering characteristic according to a second filtering parameter responsive to the tuning, wherein the first filtering parameter corresponds to the filtering characteristic.

12. The apparatus of claim 11, further comprising:
a phase locked loop (PLL) coupled to the filter and the sampling module for generating a sampling clock according to the filtered signal such that the sampling module uses the sampling clock to sample the filtered signal.

13. The method of claim 12, wherein the sampling module further comprises:

a clock tuning unit for tuning the phase of the sampling clock.

14. The apparatus of claim 13, wherein the clock tuning unit is a delay unit coupled to the PLL and the sampling module for tuning the phase of the sampling clock.

15. The apparatus of claim 11, further comprising:
a slicer coupled to the filter and the sampling module for generating a corresponding sliced signal according to the filtered signal.

16. The apparatus of claim 15, further comprising:
an asymmetry compensation module coupled to the slicer for removing the DC offset of the filtered signal.

17. The apparatus of claim 11, wherein the specified data format is a run-length limited (RLL) code.

18. The apparatus of claim 11, wherein the apparatus is set in a digital video disk (DVD) system.

* * * * *